(12) United States Patent
Shu et al.

(10) Patent No.: US 10,797,046 B1
(45) Date of Patent: Oct. 6, 2020

(54) RESISTOR STRUCTURE FOR INTEGRATED CIRCUIT, AND RELATED METHODS

(71) Applicant: GLOBALFOUNDRIES INC., Grand Cayman (KY)

(72) Inventors: Jiehui Shu, Clifton Park, NY (US); Hui Zang, Guilderland, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 16/369,788

(22) Filed: Mar. 29, 2019

(51) Int. Cl.
| | |
|---|---|
| *H01L 27/07* | (2006.01) |
| *H01L 49/02* | (2006.01) |
| *H01L 29/78* | (2006.01) |
| *H01L 23/522* | (2006.01) |
| *H01L 21/768* | (2006.01) |
| *H01L 21/762* | (2006.01) |
| *H01L 27/088* | (2006.01) |
| *H01L 27/02* | (2006.01) |
| *H01L 27/06* | (2006.01) |

(52) U.S. Cl.
CPC ........ *H01L 27/0738* (2013.01); *H01L 21/762* (2013.01); *H01L 21/76829* (2013.01); *H01L 23/5228* (2013.01); *H01L 27/0288* (2013.01); *H01L 27/0629* (2013.01); *H01L 27/0886* (2013.01); *H01L 28/00* (2013.01); *H01L 28/20* (2013.01); *H01L 28/24* (2013.01); *H01L 29/785* (2013.01)

(58) Field of Classification Search
CPC ............. H01L 27/0288; H01L 27/0629; H01L 27/0711; H01L 27/0738; H01L 27/0802; H01L 27/101; H01L 2027/11842; H01L 28/00; H01L 28/20
See application file for complete search history.

(56) References Cited

U.S. PATENT DOCUMENTS

| | | | | |
|---|---|---|---|---|
| 5,356,826 | A * | 10/1994 | Natsume | ............. H01L 27/0688 148/DIG. 136 |
| 6,445,050 | B1 * | 9/2002 | Chediak | ............ H01L 21/76838 257/252 |
| 10,038,050 | B2 | 7/2018 | Adusumilli et al. | |
| 10,079,229 | B1 * | 9/2018 | Bi | ........................ H01L 29/7851 |
| 2005/0227440 | A1 * | 10/2005 | Ema | ................ H01L 21/823857 438/275 |
| 2006/0145296 | A1 * | 7/2006 | Coolbaugh | ............. H01L 28/20 257/536 |

(Continued)

Primary Examiner — Eduardo A Rodela
(74) Attorney, Agent, or Firm — Francois Pagette; Hoffman Warnick LLC

(57) ABSTRACT

Embodiments of the disclosure provide a resistor structure for an integrated circuit (IC) and related methods. The resistor structure may include: a shallow trench isolation (STI) region on a substrate; a resistive material above a portion of the shallow trench isolation (STI) region; a gate structure on another portion of the STI region, above the substrate, and horizontally displaced from the resistive material; an insulative barrier above the STI region and contacting an upper surface and sidewalls of the resistive material, an upper surface of the insulative barrier being substantially coplanar with an upper surface of the gate structure; and a pair of contacts within the insulative barrier, and each positioned on an upper surface of the resistive material.

18 Claims, 17 Drawing Sheets

(56) References Cited

U.S. PATENT DOCUMENTS

| | | | |
|---|---|---|---|
| 2010/0148262 A1* | 6/2010 | Stahrenberg | H01L 27/0629 |
| | | | 257/350 |
| 2010/0301417 A1 | 12/2010 | Cheng et al. | |
| 2012/0175749 A1 | 7/2012 | Haensch et al. | |
| 2012/0299115 A1* | 11/2012 | Chuang | H01L 21/31055 |
| | | | 257/379 |
| 2013/0015531 A1* | 1/2013 | Kim | H01L 21/28123 |
| | | | 257/380 |
| 2013/0207221 A1* | 8/2013 | McMullan | H01L 29/66143 |
| | | | 257/476 |
| 2014/0011333 A1* | 1/2014 | McKee | H01L 23/5256 |
| | | | 438/210 |
| 2015/0303246 A1* | 10/2015 | Shi | H01L 21/76224 |
| | | | 257/506 |
| 2015/0318341 A1* | 11/2015 | Lai | H01L 23/5228 |
| | | | 257/506 |
| 2017/0012041 A1* | 1/2017 | Chong | H01L 23/5228 |
| 2018/0254315 A1* | 9/2018 | Verma | H01L 28/24 |
| 2019/0097016 A1* | 3/2019 | Alptekin | H01L 29/66795 |

* cited by examiner

RESISTOR STRUCTURE FOR INTEGRATED CIRCUIT, AND RELATED METHODS

BACKGROUND

The present disclosure relates to integrated circuit (IC) structure formation, and more specifically, to a resistor structure for an IC, and related methods to form the resistor structure.

Manufacturing of IC structures requires formation of individual circuit elements, e.g., transistors such as field-effect-transistors (FETs) and the like, based on specific circuit designs. A FET generally includes source, drain, and gate regions. The gate region is placed between the source and drain regions and controls the current through a channel region (often shaped as a semiconductor fin) between the source and drain regions. Gates may be composed of various metals and often include a work function metal (WFM) which is chosen to create desired characteristics of the FET, and a gate metal conductor over the WFM. Transistors may be formed over a substrate and may be electrically isolated with an insulating dielectric layer, e.g., inter-level dielectric (ILD) layer. Metal wires and contacts may be formed to each of the source, drain, and metal gate structures through the ILD layer to electrically connect the transistors to other circuit elements that may be formed subsequent to the transistor in other levels.

Electrical resistors work in tandem with transistors and other components to implement functions of an IC device. In some cases, a fabricator may retain portions of a non-operational gate structure, also known as a "dummy gate" in the final structure to act as a resistive coupling between wires. Advances in FET technology, however, rely on aggressive chemical mechanical planarization (CMP) during subsequent fabrication. The subsequent CMP will degrade or even remove remaining portions of dummy gate material, thereby impeding such material from being an effective resistor.

SUMMARY

A first aspect of the disclosure is directed to a resistor structure for an integrated circuit (IC), the resistor structure including: a shallow trench isolation (STI) region on a substrate; a resistive material above a portion of the shallow trench isolation (STI) region; a gate structure on another portion of the STI region, above the substrate, and horizontally displaced from the resistive material; an insulative barrier above the STI region and contacting an upper surface and sidewalls of the resistive material, wherein an upper surface of the insulative barrier is substantially coplanar with an upper surface of the gate structure; and a pair of contacts within the insulative barrier, and each positioned on an upper surface of the resistive material.

A second aspect of the disclosure includes a method of forming a resistor structure for an integrated circuit (IC), the method including: forming a gate structure over a shallow trench isolation (STI) region; forming an opening within the gate structure to separate a targeted section of the gate structure from a remainder of the gate structure; implanting a dopant into the targeted section of the gate structure to form a resistive material; forming an insulative barrier over the STI region and the resistive material, such that the insulative barrier contacts an upper surface and sidewalls of the resistive material; and forming a pair of contacts to an upper surface of the resistive material within the insulative barrier to form the resistor structure.

A third aspect of the disclosure provides a method of forming a resistor structure for an integrated circuit (IC), the method including: forming a gate structure over a shallow trench isolation (STI) region; forming an opening within the gate structure to separate a targeted section of the gate structure from a remainder of the gate structure; removing the targeted section of the gate structure to expose an upper surface of the STI region; forming a resistive material above the exposed upper surface of the STI region; forming an insulative barrier over the STI region and the resistive material, such that the insulative barrier contacts an upper surface and sidewalls of the resistive material; and forming a pair of contacts to an upper surface of the resistive material within the insulative barrier to form the resistor structure.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
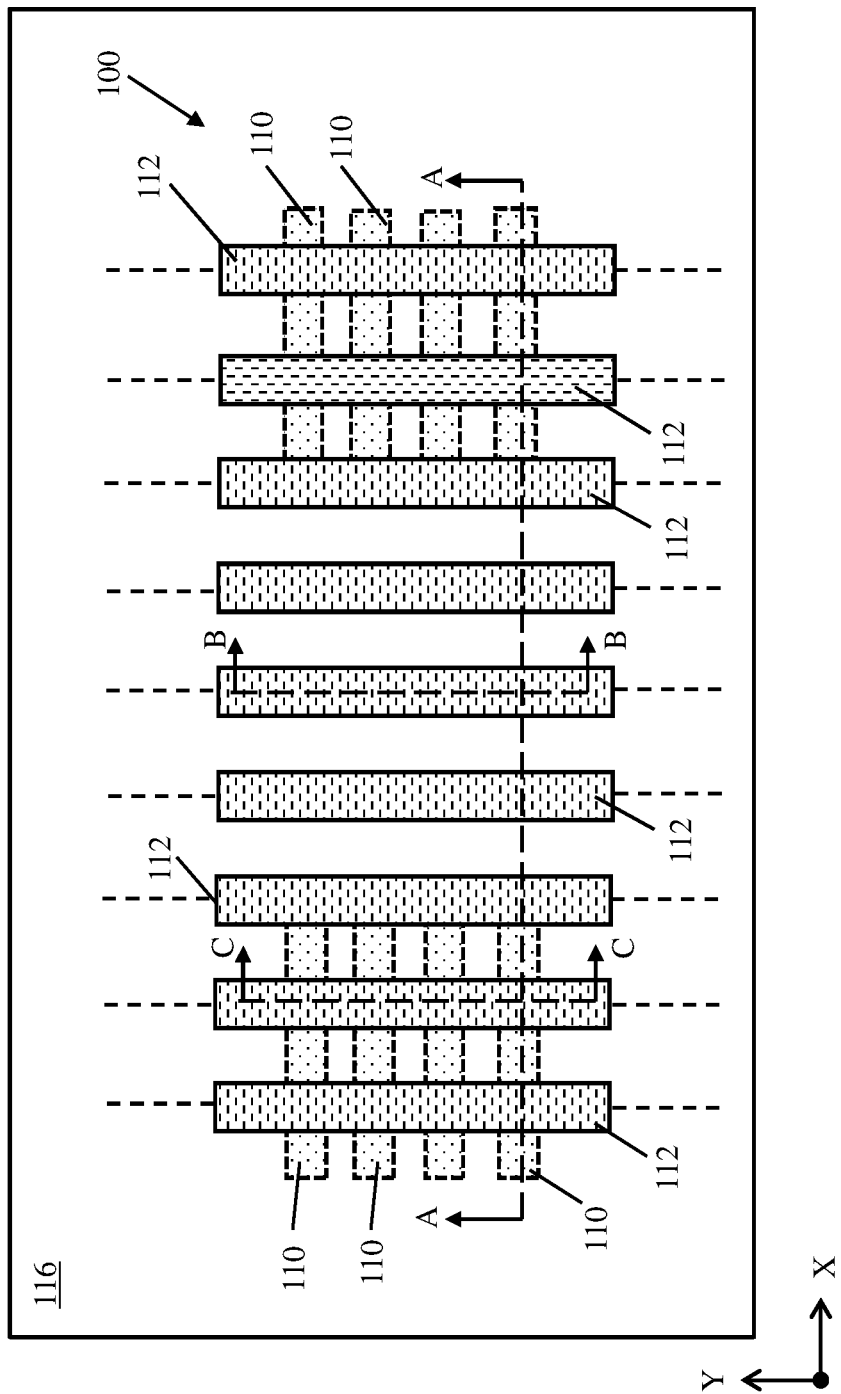
FIG. 1 shows a plan view of a preliminary structure to be processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure provide a resistor structure for an IC, and related methods to form the resistor structure. Embodiments of the resistor structure may include a shallow trench isolation (STI) region on a substrate, a resistive material above a portion of the STI region, and a gate structure on another portion of the STI region and horizontally displaced from the resistor material. An insulative barrier may be located above the STI region, and in contact with an upper surface and sidewalls of the resistive material. A pair of contacts to the resistive material may extend vertically through the insulative barrier. The two contacts may be positioned on an upper surface of the resistive material, and each contact may be located at or near an opposing end of the resistive material. Methods according to embodiments of the disclosure are operable to form the resistor structure, and optionally may form other portions of an IC.

FIG. 1 shows a plan view of a preliminary structure 100 to be processed according to embodiments of the disclosure. It is noted that the plan view of FIG. 1 shows some, but not all, parts of preliminary structure 100 for perspective relative to subsequent drawings that show more detail via a cross-sectional views along lines A-A, B-B, and/or C-C in FIG. 1. The example preliminary structure 100 of FIG. 1 provides one initial set of materials targeted for use with embodiments of the disclosure, but it is understood that embodiments of the disclosure may be implemented on different designs without significant changes to the various example techniques discussed herein.

Figure 2:
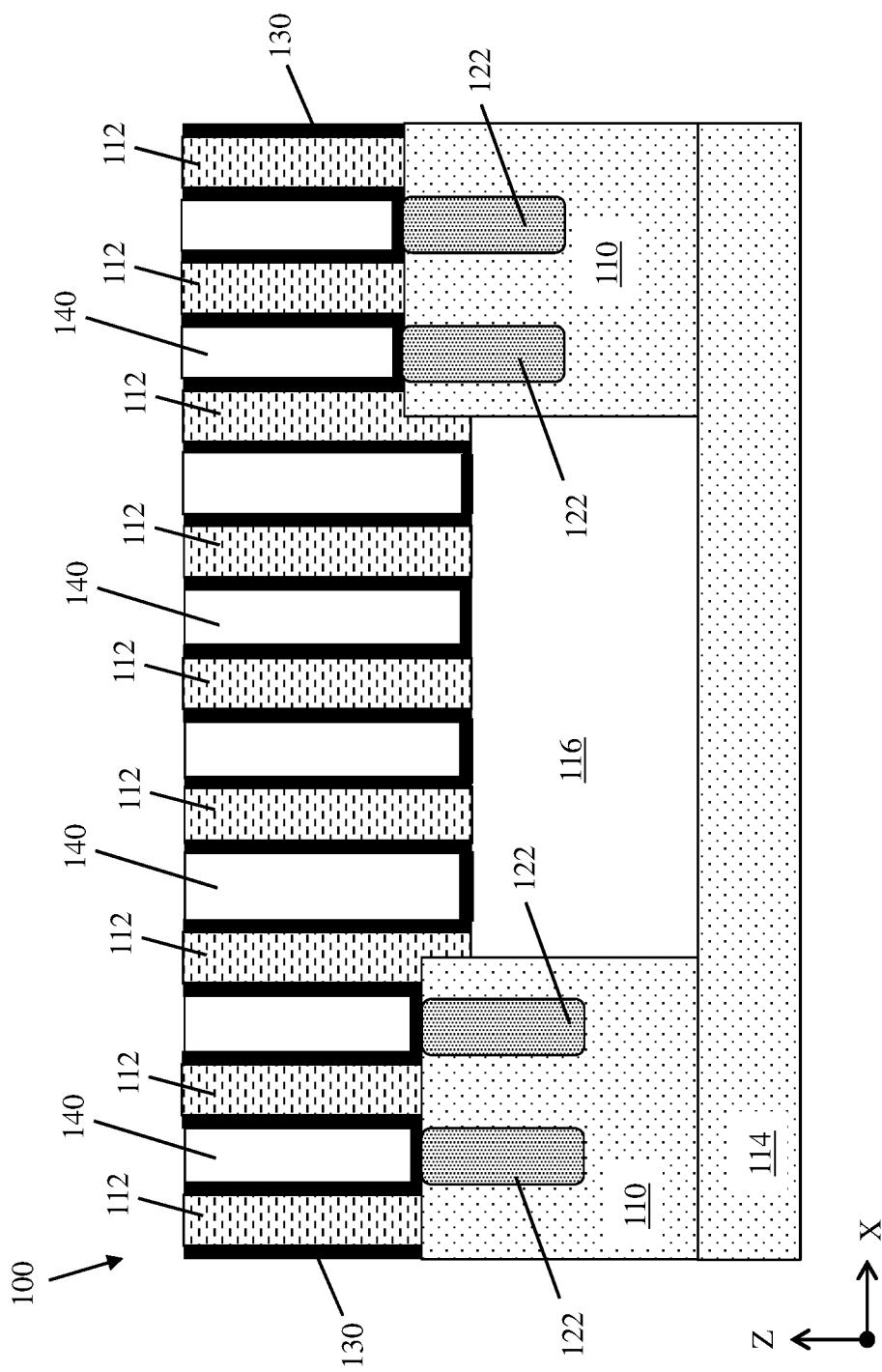
FIG. 2 shows a first cross-sectional view along line A-A of the preliminary structure of FIG. 1.

As shown in FIG. 1, preliminary structure 100 can include a set (i.e., one or more) of active semiconductor regions 110 extending in parallel with each other, with four active semiconductor regions 110 being provided as an example. Active semiconductor regions 110 are referred to as "active" because they may form a part of a channel region of a transistor. For purposes of description, active semiconductor regions 110 may be described as semiconductor fins. It will be recognized by those with skill in the art that active semiconductor regions 110 can take a variety of forms, e.g., bulk semiconductor, semiconductor nanosheets, etc. Preliminary structure 100 may also include a set (i.e., one or more) of preliminary gate structures 112 extending transversely over active semiconductor regions 110 over substrate 114 (FIG. 2). Each preliminary gate structure 112 may include one or more electrically insulative materials not intended for use in the eventual IC structure, and thus may be described as "dummy gate structures." For example, each preliminary gate structure 112 may include polycrystalline silicon (poly-Si), amorphous silicon (a-Si), microcrystalline silicon (μc-Si), and/or other semiconductor or non-semiconductor placeholder materials. A shallow trench isolation (STI) 116 of preliminary structure 100, may be positioned underneath and adjacent to active semiconductor region(s) 110 and preliminary gate structure(s) 112. For instance, some preliminary gate structures 112 may be formed deliberately on portions of STI 116 without contacting any semiconductor material thereunder. Preliminary gate structure(s) 112 contacting and overlying STI 116 may define precursor materials to form a resistor structure as described herein, while other preliminary gate structure(s) 112 over active semiconductor region(s) 110 may be replaced to form the gate of a transistor as described herein. Line A-A in FIG. 1 creates a view line showing preliminary gate structure(s) 112 positioned over corresponding active semiconductor region(s) 110 in preliminary structure 100. Each active semiconductor region 110 may include source and/or drain regions 122 (simply "source/drain regions" or "S/D regions" hereafter) adjacent preliminary gate structure(s) 112. S/D regions 122 may define a "source/drain area" of active semiconductor region 110.

Methods according to the disclosure may include providing preliminary structure 100. As best shown in FIG. 2 with occasional reference to FIG. 1, embodiments of the disclosure may include providing a preliminary gate structure 112 over active semiconductor region 110, e.g., a fin, over a substrate 114. The providing may also include forming a spacer 130 adjacent preliminary gate structure 112, which may include one or more insulative dielectric materials.

Preliminary structure 100 may be provided in a number of ways, e.g., by formation thereof, or otherwise obtaining the structure. A brief explanation of embodiments of forming preliminary structure 100 will be described. The brief description of preliminary structure 100 formation is only illustrative, and should not be considered limiting. Generally, preliminary structure 100 may be formed using any now known or later developed semiconductor fabrication techniques. For example, preliminary structure 100 may be formed using photolithographic techniques. In photolithography, a radiation sensitive "resist" coating is formed over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example.

Each active semiconductor region 110 may be formed from an underlying semiconductor substrate 114, e.g., by removing targeted portions of substrate 114 to a predetermined depth, causing the non-removed portions to form active semiconductor regions 110 directly on substrate 114. Substrate 114 and active semiconductor regions 110 may include, e.g., one or more currently-known or later developed semiconductor substances generally used in semiconductor manufacturing, including without limitation: silicon (e.g., crystal silicon), germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

A shallow trench isolation (STI) 116 (FIG. 2 only) may be positioned on substrate 114, as well as between active semiconductor regions 110 and preliminary gate structures 112. Each STI 116 (FIG. 2) may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. STI 116 may be formed by deposition. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. For example, STI 116 may be formed using CVD.

Source/drain (S/D) regions 122 may also be formed in or on active semiconductor regions 110. S/D regions 122 may be formed using any now known or later developed technique to distinguish the source or drain of a transistor from other regions of a semiconductor material. For example, S/D regions 122 may be formed within active semiconductor region 110, e.g., by forming openings (not shown) within active semiconductor region 110 and epitaxially growing another semiconductor material within the openings, thereby forming S/D regions 122 via epitaxy with a different material composition from the remainder of active semiconductor region 110. Preliminary gate structures 112 and spacer 130 may shield a portion of active semiconductor region 110 when the epitaxial S/D regions 122 are being formed. S/D regions 122 may include the same semiconductor material of active semiconductor region 110, or a different semiconductor material, but with dopants therein. S/D regions 122, after being doped, may have a different composition from the remainder of active semiconductor region 110. To form S/D regions 122, selected portions of active semiconductor region 110 may be implanted with a strain-inducing material, such as silicon germanium or silicon carbon, formed on active semiconductor regions composed of silicon, silicon germanium, and/or silicon carbon. The dopants used to form S/D regions 122 may be introduced in situ or an implantation process may be performed to affect only S/D regions 122 of preliminary structure 100. According to an example, active semiconductor region 110 is not previously doped before S/D regions 122 are formed within preliminary structure 100. A doping process may be performed to dope active semiconductor region(s) 110 and S/D regions 122. If a lightly doped source/drain region is desired, the doping can occur after forming preliminary gate structures 112, but before forming spacer 130. An anneal may be performed to drive in dopants to form S/D regions 122.

Spacer 130 may be formed adjacent to preliminary gate structures 112. More particularly, spacer 130 may be positioned on adjacent vertical sidewalls of preliminary gate structure 112, i.e., spacer 130 abuts the sidewall of preliminary gate structure 112. Spacer 130 may be provided, e.g., by deposition, thermal growth, etc., on preliminary gate structures 112. Spacer 130 may be formed on or adjacent to preliminary gate structure(s) 112 to electrically and physically separate preliminary gate structure(s) 112 from other components of preliminary structure 100. Spacer 130 may include a low dielectric constant (low-K) material, i.e., any dielectric material with a dielectric constant of at most approximately 3.9. Examples of a low-K material may include but is not limited to: silicon carbon oxynitride (SiCON), silicon carbon nitride (SiCN), spin-on low-K films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-K (ELk) materials (available from Applied Materials). An example of an HSQ material is FOx™ (available from Dow Corning), silicon nitride ($Si_3N_4$), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. Spacer 130 may be formed by deposition and subsequent patterning, e.g., by etching as discussed herein.

Preliminary structure 100 formation may also include forming an inter-level dielectric (ILD) 140, i.e., over active semiconductor region(s) 110, substrate 114, STI(s) 116, and over and/or alongside preliminary gate structure(s) 112. ILD 140 may be formed by non-selective or selective deposition, such that ILD 140 initially covers portions of active semiconductor region(s) 110 and STI(s) 116. ILD 140 may include any now known or later developed ILD material such as but not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

Figure 4:
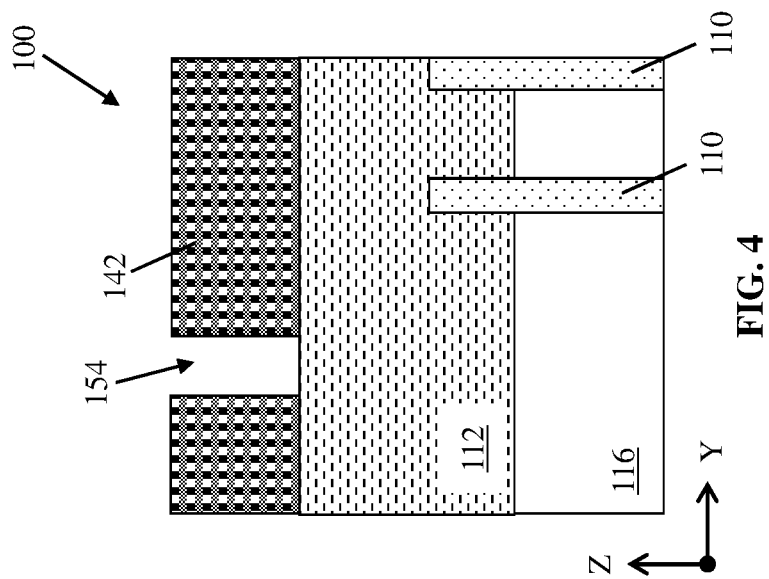
FIG. 4 shows a cross-sectional view along line C-C of FIG. 1 of forming the mask on another gate structure according to embodiments of the disclosure.
Figure 3:
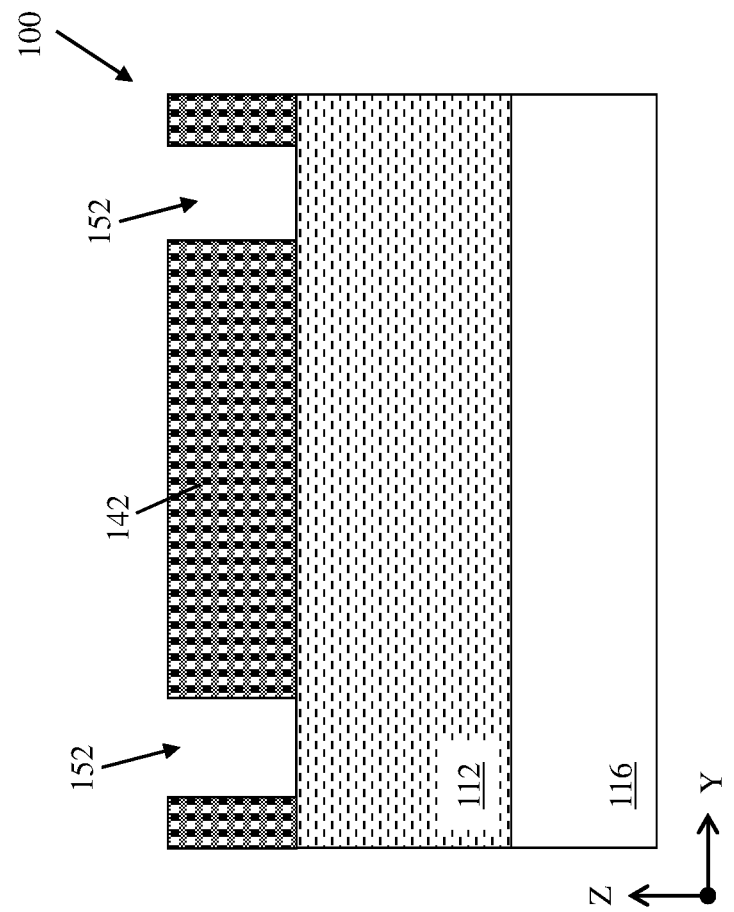
FIG. 3 shows a cross-sectional view along line B-B of FIG. 1 of forming a mask on a gate structure according to embodiments of the disclosure.

Referring to FIGS. 3 and 4, the disclosure provides methods to form a resistor structure from preliminary structure 100 (FIGS. 1, 2). FIG. 3 depicts a cross-sectional view of one preliminary gate structure 112 in preliminary structure 100 along line B-B of FIG. 1. FIG. 4 depicts a cross-sectional view of another preliminary gate structure 112 in preliminary structure 100 along line C-C of FIG. 1. As shown in FIGS. 3 and 4, a mask 142 may be deposited over preliminary gate structures 112 as shown, and additionally may contact and overlie portions of ILD 140 (FIGS. 1, 2; not shown in FIGS. 3, 4). Mask 142 may be patterned to include openings 152 (FIG. 3), 154 (FIG. 4) at respective locations. Openings 152 of mask 142 may be located above preliminary gate structure(s) 112 which overlie STI(s) 116 without being positioned over active semiconductor region(s) 110. Opening(s) 154 of mask 142, where applicable, may be located over portions of preliminary gate structure(s) 112 that overlie STI(s) 116, at a location horizontally displaced from active semiconductor region(s) 110.

Figure 6:
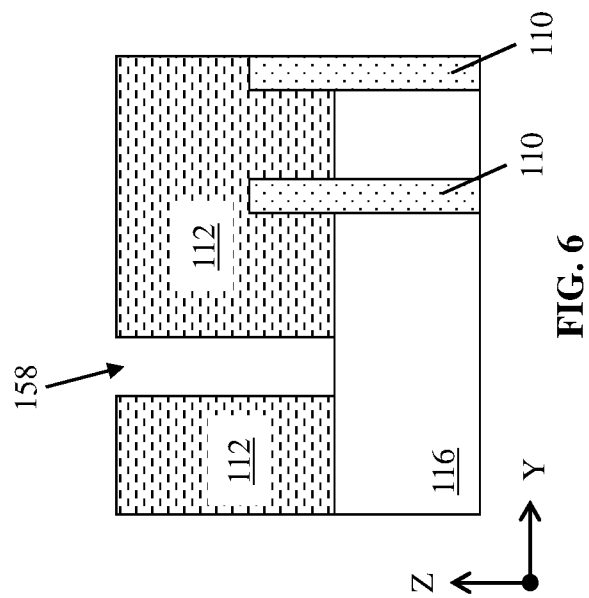
FIG. 6 shows a cross-sectional view along line C-C of FIG. 1 of forming an additional opening within another gate structure according to embodiments of the disclosure.
Figure 5:
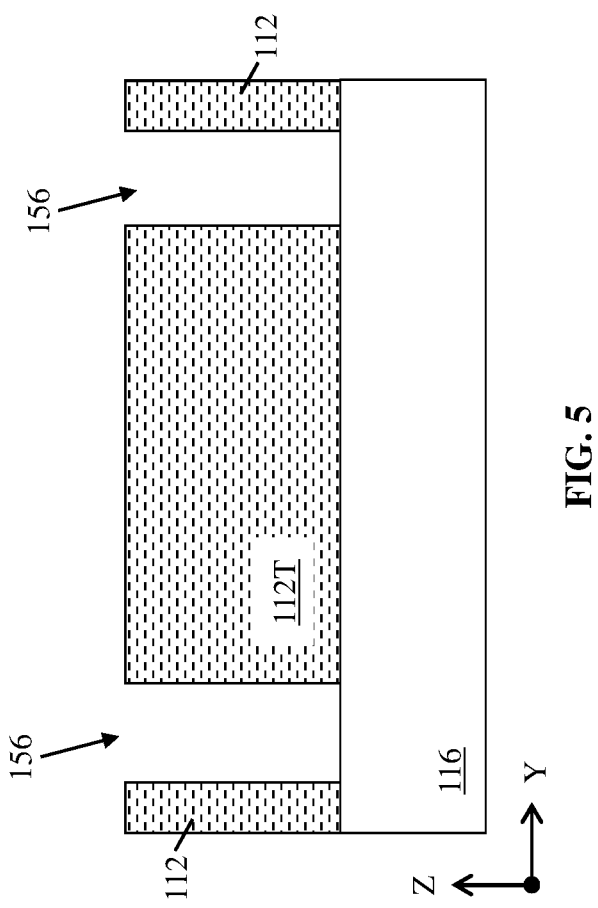
FIG. 5 shows a cross-sectional view along line B-B of FIG. 1 of separating a targeted portion of the gate structure according to embodiments of the disclosure.

Turning to FIGS. 5 and 6, methods according to the disclosure may continue by forming openings 156, 158 in preliminary gate structure(s) 112 using mask 142 (FIGS. 3, 4). Openings 156 (FIG. 5) may be positioned beneath the original location of opening(s) 152, and may be sized to expose an upper surface of STI(s) 116 thereunder. A pair of opening(s) 156 may separate a targeted portion of gate structure (simply "targeted portion" hereafter) 112T from a remainder of preliminary gate structure 112. Opening(s) 158 optionally may be formed in a different preliminary gate structure 112 to expose an underlying portion of STI(s) 116 horizontally displaced from active semiconductor region(s) 110. Mask 142 may be removed, e.g., by stripping of photoresist material, after openings 156, 158 are formed.

Figure 8:
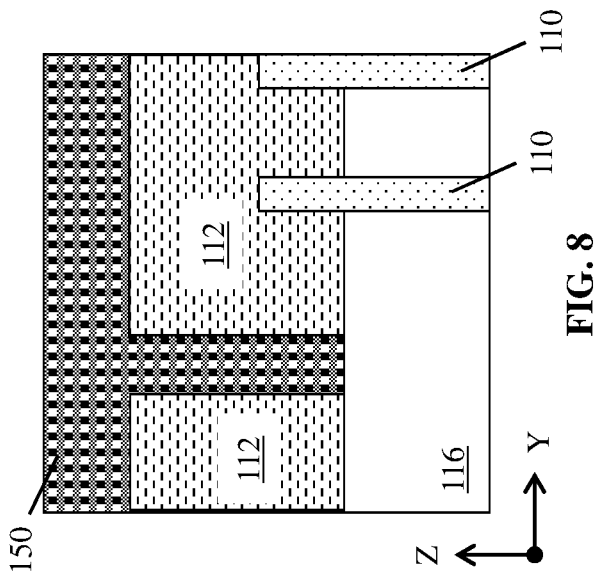
FIG. 8 shows a cross-sectional view along line C-C of FIG. 1 of forming the mask over another gate structure and within an additional opening according to embodiments of the disclosure.
Figure 7:
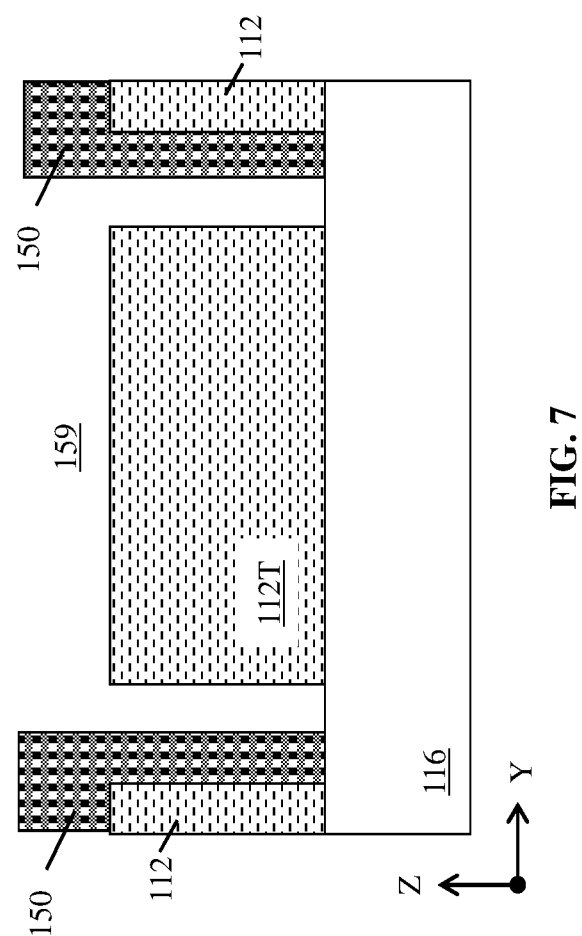
FIG. 7 shows a cross-sectional view along line B-B of FIG. 1 of forming a mask to prepare the targeted section of the gate structure for etching according to embodiments of the disclosure.

Referring now to FIGS. 7 and 8, continued processing according to the disclosure may form a resistive material 162 (FIG. 11, discussed below) from targeted portion 112T (FIG. 5). In further embodiments, a same-size or similarly-sized region of resistive material 162 may be formed by different processes. The example processing paradigms in some cases may be implemented separately, and in still further examples various processes described herein may be combinable and/or used independently on the same structure. As shown in FIGS. 7 and 8, embodiments of the disclosure may include forming another mask 150 over preliminary gate structures 112. Similar to mask 142 discussed elsewhere herein, mask 150 may be formed initially by deposition, and thereafter may be patterned to include various openings to target underlying materials for processing. Mask 150 thus may include an opening 159 above targeted portion 112T and the portion of STI 116 thereunder. Mask 150 may cover opening 158 (FIG. 6) of other preliminary gate structures 112. With mask 150 in place, it is possible to process targeted portion 112T independently of other preliminary gate structures 112.

Figure 10:
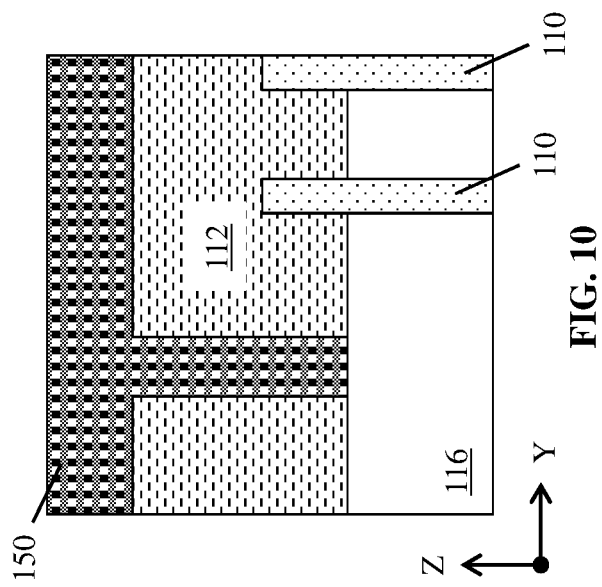
FIG. 10 shows a cross-sectional view along line C-C of FIG. 1 while recessing the targeted section of the gate structure according to embodiments of the disclosure.
Figure 9:
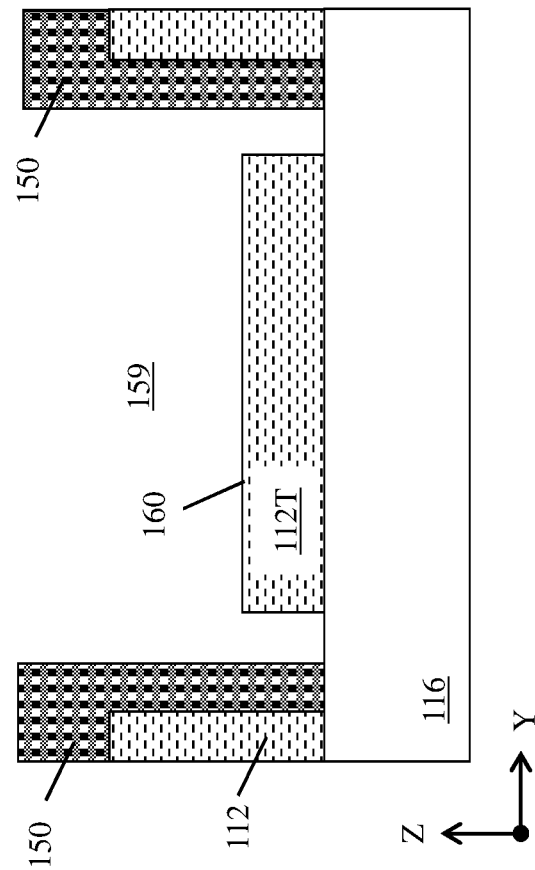
FIG. 9 shows a cross-sectional view along line B-B of FIG. 1 of recessing the targeted section of the gate structure according to embodiments of the disclosure.

Referring to FIGS. 9 and 10, targeted portion 112T may be recessed in a next step of a method according to embodiments of the disclosure. Reactive ion etching (RIE) is one technique suitable for the recessing of targeted portion 112T. Etching generally refers to the removal of material from a substrate (or structures formed on the substrate), and is often performed with a mask (e.g., mask 150) in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. The recessing may include any now known or later developed etching process appropriate to recess the dummy gate material of targeted portion 112T, e.g., RIE for polycrystalline silicon (poly-Si).

The recessing may rely on mask 150 to direct the etching. Mask 150 may protect other preliminary gate structures 112 and other covered materials from being etched with targeted portion 112T. As illustrated, after recessing, targeted portion 112T has an upper surface 160 that is below the height of other preliminary gate structures 112. The amount of recessing, i.e., the depth, can be user defined to control the size of targeted portion 112T on STI 116. The size of targeted portion 112T may define the eventual size of a resistor formed therefrom, and thus may be controlled to adjust the amount of electrical resistance of the resistor. In alternative embodiments described elsewhere herein, targeted portion 112T may be removed entirely. Several subsequent drawings, e.g., FIGS. 11-12 assume at least some of targeted portion 112T remains intact after the recessing.

Figure 11:
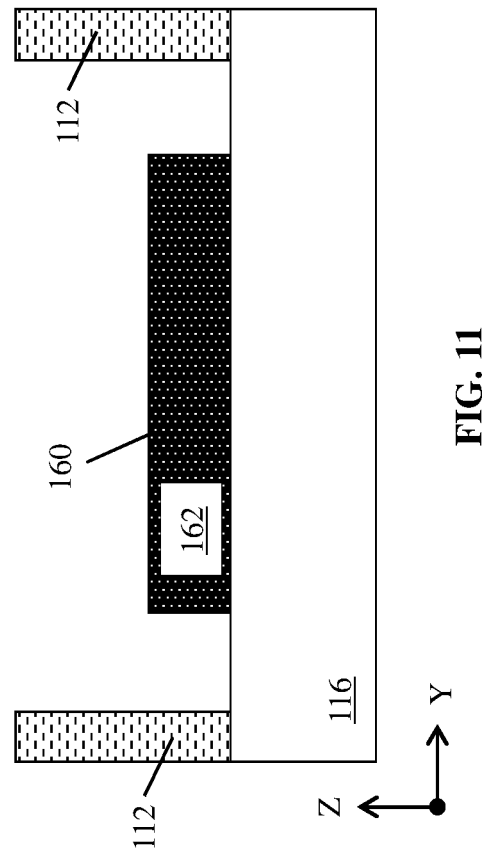
FIG. 11 shows a cross-sectional view along line B-B of FIG. 1 of implanting a dopant into the targeted section of the gate structure to form a resistive material according to embodiments of the disclosure.
Figure 12:
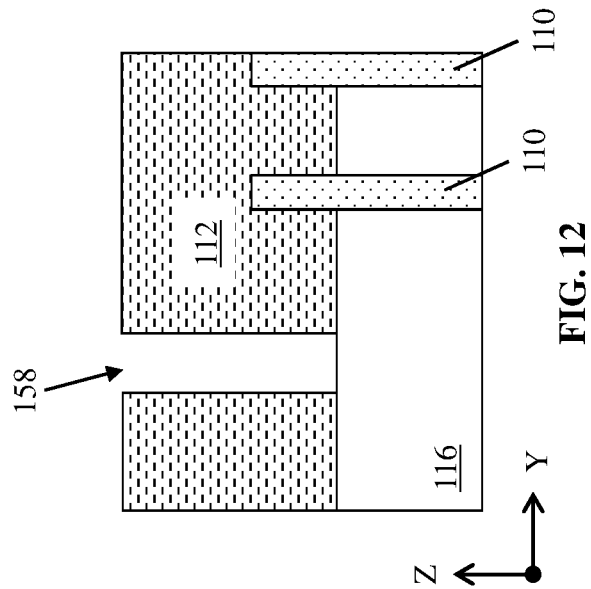
FIG. 12 shows a cross-sectional view along line C-C of FIG. 1 of removing the mask from another gate structure and the additional opening according to embodiments of the disclosure.

FIGS. 11 and 12 depict an embodiment of using targeted portion 112T (FIGS. 5, 7, 9) as a precursor of the eventual resistor structure. According to an embodiment, the disclosure may include implanting dopants into targeted portion of targeted portion 112T. The implantation process may include implanting one or more ions into the poly-Si material of targeted portion 112T to convert the material into resistive material 162. Such dopants may include, e.g., boron (B), phosphorous (P), arsenic (As), and/or other ions or materials capable of reacting with poly-Si to form resistive material 162. In still further embodiments, the resistive material 162 formed from targeted portion 112T may include other resistive substances capable of being formed from semiconductor, e.g., titanium nitride (TiN) and/or tungsten silicide (WSi). Resistive material 162 thus may include any currently known or later developed material capable of transmitting electrical current, but with a significant energy dissipation and corresponding reduction in voltage across the material. Mask 150 (FIGS. 7-10) may initially remain in place during the implantation, to prevent resistive material 162 being formed from other preliminary gate structures 112. After forming resistive material 162, mask 150 may be removed by any currently known or later-developed process (e.g., stripping or selective etch) to re-expose preliminary gate structures 112, and opening(s) 158 (FIG. 12 only) where applicable.

Figure 14:
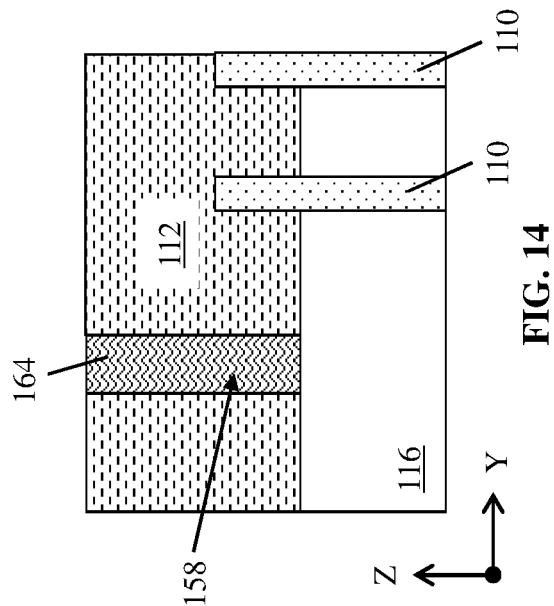
FIG. 14 shows a cross-sectional view along line C-C of FIG. 1 of forming the insulative barrier within the additional opening according to embodiments of the disclosure.
Figure 13:
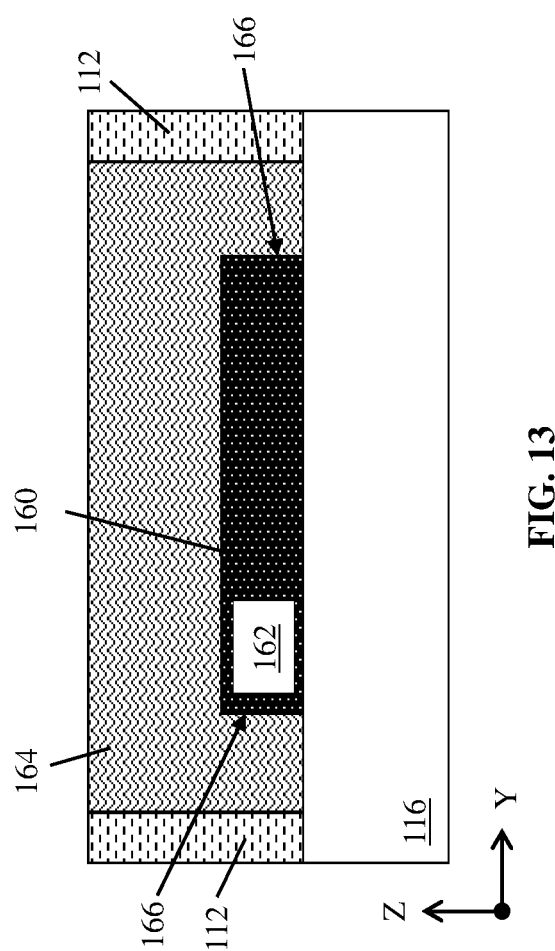
FIG. 13 shows a cross-sectional view along line B-B of FIG. 1 of forming an insulative barrier over the resistive material according to embodiments of the disclosure.

Continuing to FIGS. 13 and 14, embodiments of the disclosure may include forming an insulative barrier 164 to physically and electrically separate resistive material 162 from preliminary gate structures 112 and any overlying components. Insulative barrier 164 may include any currently known or later developed dielectric material suitable to electrically insulate different structures from each other. According to one example, insulative barrier 164 may include one or more nitride-based insulators such as silicon nitride (SiN). However, insulative barrier 164 may additionally or alternatively include other types of insulators in further embodiments, including those discussed by example with respect to STI 116 and/or ILD 140 (FIG. 2). Insulative barrier 164 may be formed, e.g., by selective or non-selective deposition. Insulative barrier 164 may be deposited to cover STI 116 and resistive material 162, such that insulative barrier 164 contacts upper surface 160 and a pair of sidewalls 166 of resistive material 162. Insulative barrier 164 may be formed within opening 158 (FIG. 14 only) of other preliminary gate structures 112. Initially, portions of insulative barrier 164 may contact and overlie preliminary gate structures 112 when the deposition ends. Insulative barrier may be recessed and/or planarized (e.g., by chemical mechanical planarization (CMP)) and/or other techniques, thereby causing insulative barrier 164 to be substantially coplanar with preliminary gate structures 112 along its upper surface.

Additional or alternative processes according to the present disclosure are shown in FIGS. 15-20. The processes depicted in FIGS. 15-20 may be implemented as an alternative to one or more processes shown in FIGS. 7-12, or selected aspects of each set of processes may be implemented together in still further embodiments. FIGS. 15-20 are presented as an alternative solely for the sake of explanation.

Figure 16:
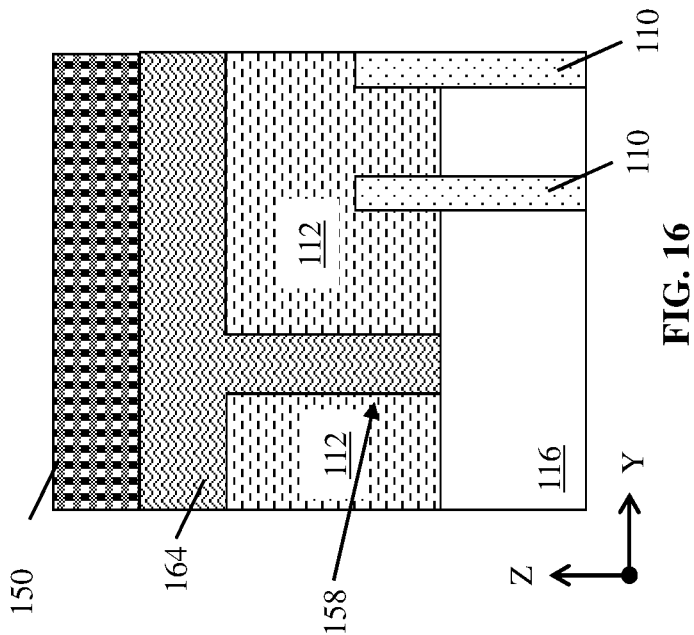
FIG. 16 shows a cross-sectional view along line C-C of FIG. 12 of forming the insulative barrier and mask over another gate structure and the dielectric according to further embodiments of the disclosure.
Figure 15:
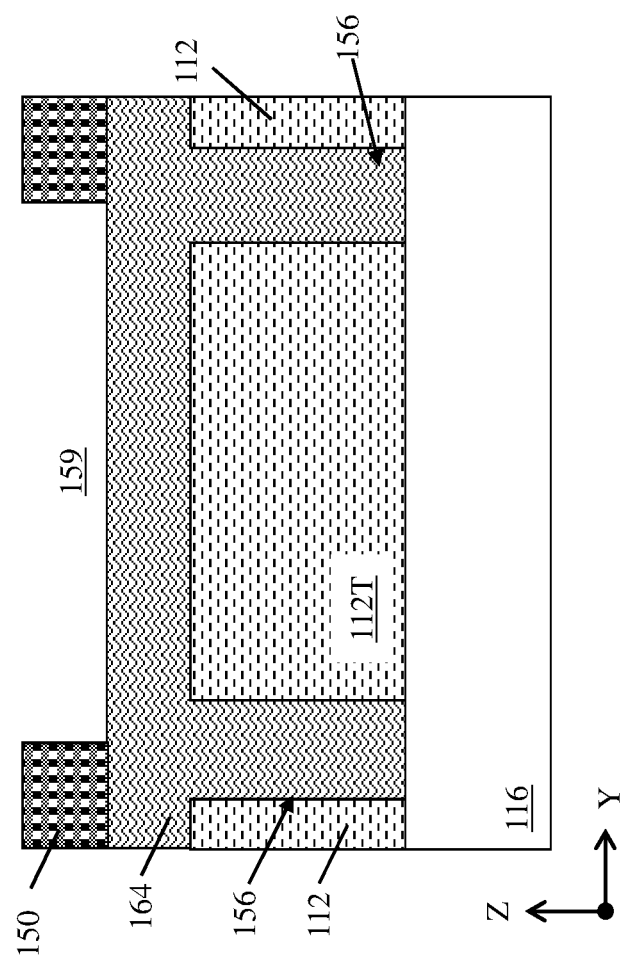
FIG. 15 shows a cross-sectional view along line B-B of FIG. 1 of forming an insulative barrier and mask over non-targeted sections of the gate structure according to further embodiments of the disclosure.

FIGS. 15 and 16 depict a process in which portions of insulative barrier 164 are formed before the forming of resistive material 162 (FIGS. 10-14). The process shown in FIGS. 15 and 16 may follow, e.g., etching preliminary gate structure(s) 112 to form openings 156, 158 and targeted portion 112T as described elsewhere herein. Insulative barrier 164 may be deposited within openings 156, 158 to cover STI(s) 116 and preliminary gate structures 112, including targeted portion 112T. Initially, insulative barrier may extend to a height above that of preliminary gate structures 112 and targeted portion 112T. Thereafter, mask 150 may be formed on insulative barrier 164. Opening 159 of mask 150 may be positioned over targeted portion 112T, as discussed in embodiments where insulative barrier is not formed before resistive material 162.

Figure 18:
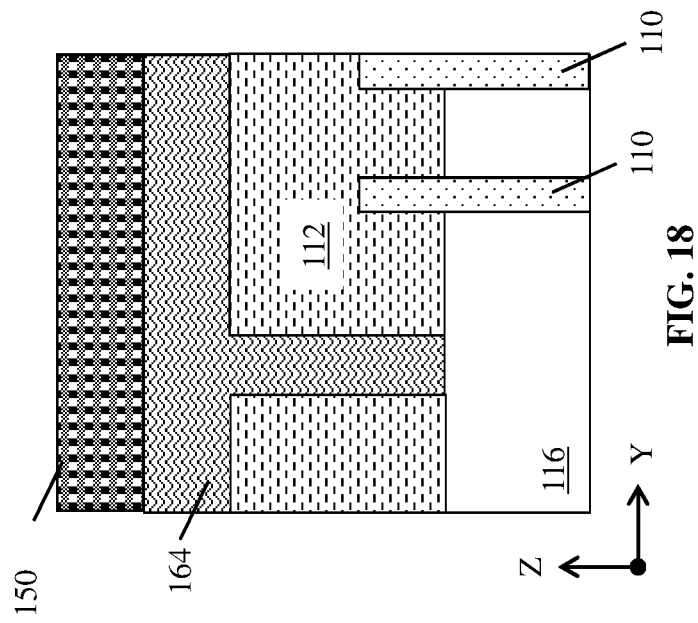
FIG. 18 shows a cross-sectional view along line C-C of FIG. 1 while removing the targeted section of the gate structure according to further embodiments of the disclosure.
Figure 17:
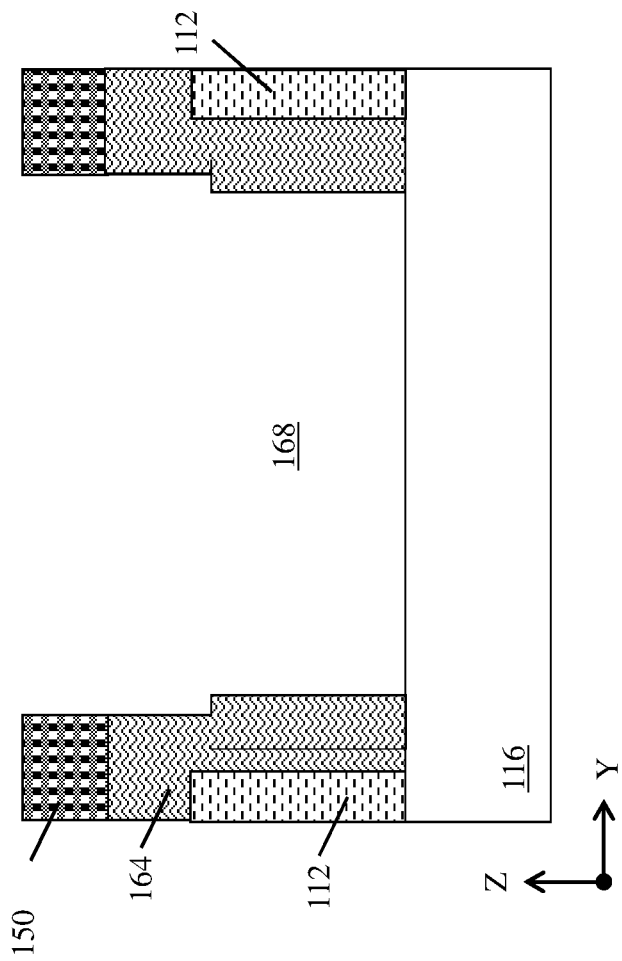
FIG. 17 shows a cross-sectional view along line B-B of FIG. 1 of removing the targeted section of the gate structure according to further embodiments of the disclosure.

Proceeding to FIGS. 17 and 18, the disclosure may include downwardly etching portions of insulative barrier 164 and targeted portion 112T (FIG. 15) below opening 159 (FIG. 15) of mask 150. Insulative barrier 164 and targeted portion 112T may be etched, e.g., selectively or non-selectively to expose STI(s) 116 thereunder. Other structures covered by mask 150, e.g., preliminary gate structure(s) 112 and other portions of insulative barrier 164 shown in FIG. 18, may remain intact and protected from the etching. Some portions of insulative barrier 164 not positioned beneath mask 150 may remain intact after the etching, e.g., due to insulative barrier 164 being formed of a more etch-resistant material than targeted portion 112T. The etching of insulative barrier 164 and targeted portion 112T may form a gap 168 over STI 116 between preliminary gate structures 112 and remaining portions of insulative barrier 164. In any case, the etching may completely remove targeted portion 112T.

Figure 20:
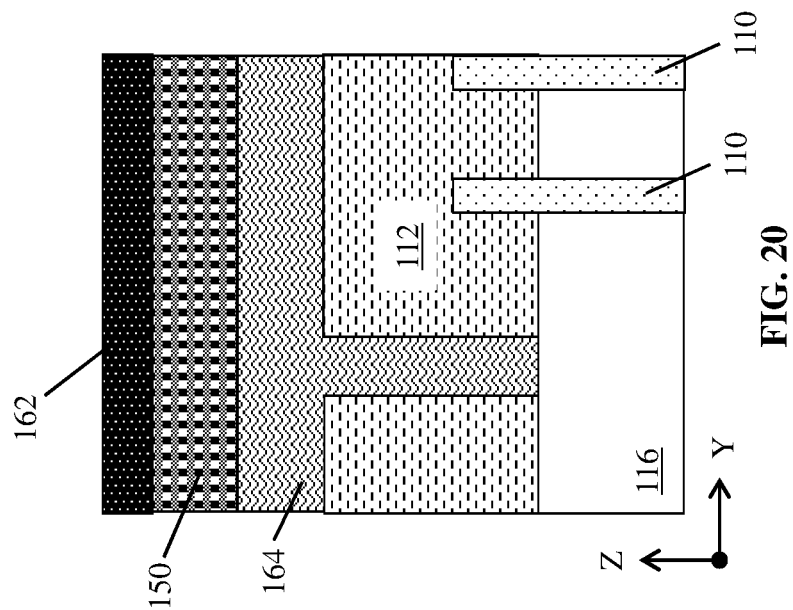
FIG. 20 shows a cross-sectional view along line C-C of FIG. 1 of another gate structure while depositing the resistive material according to further embodiments of the disclosure.
Figure 19:
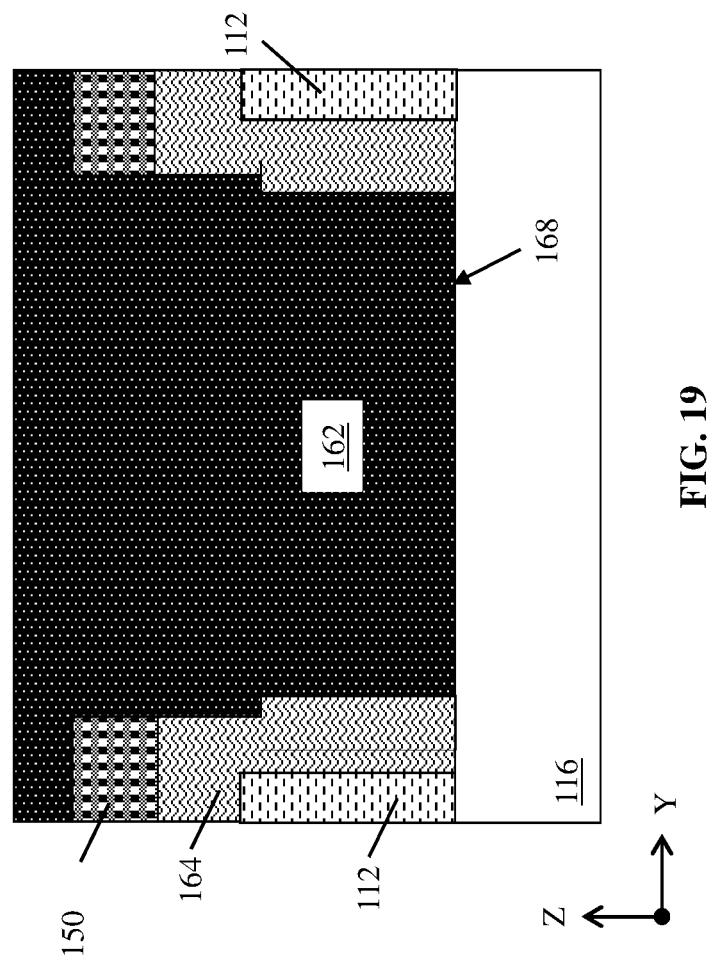
FIG. 19 shows a cross-sectional view along line B-B of FIG. 1 of depositing a resistive material according to further embodiments of the disclosure.

Referring now to FIGS. 19 and 20, the disclosure may include depositing resistive material 162 to fill gap 168. Resistive material 162 initially may completely fill gap 168, and also may be formed over mask 150. According to this example, the deposited resistive material 162 optionally may not be a derivative of poly-Si, and may include any currently known or later-developed resistive material. For example, resistive material 162 may include titanium nitride TiN, WSi, and/or other materials appropriate for use in a resistor. For instance, resistive material 162 may include a copper-based resistor suitable for IC devices. Next, resistive material 162 may be etched back selectively or non-selectively to a desired height above STI(s) 116. According to an example, the etching may cause remaining amounts of resistive material to resemble the shape and size depicted in FIG. 11. Mask 150 may be removed thereafter. Portions of gap 168 may then be re-filled by depositing and planarizing additional amounts of insulative barrier 164. The resulting structure will thus resemble the configuration of resistive material 162 and insulative barrier 164 shown in FIG. 13 and described elsewhere herein.

Figure 21:
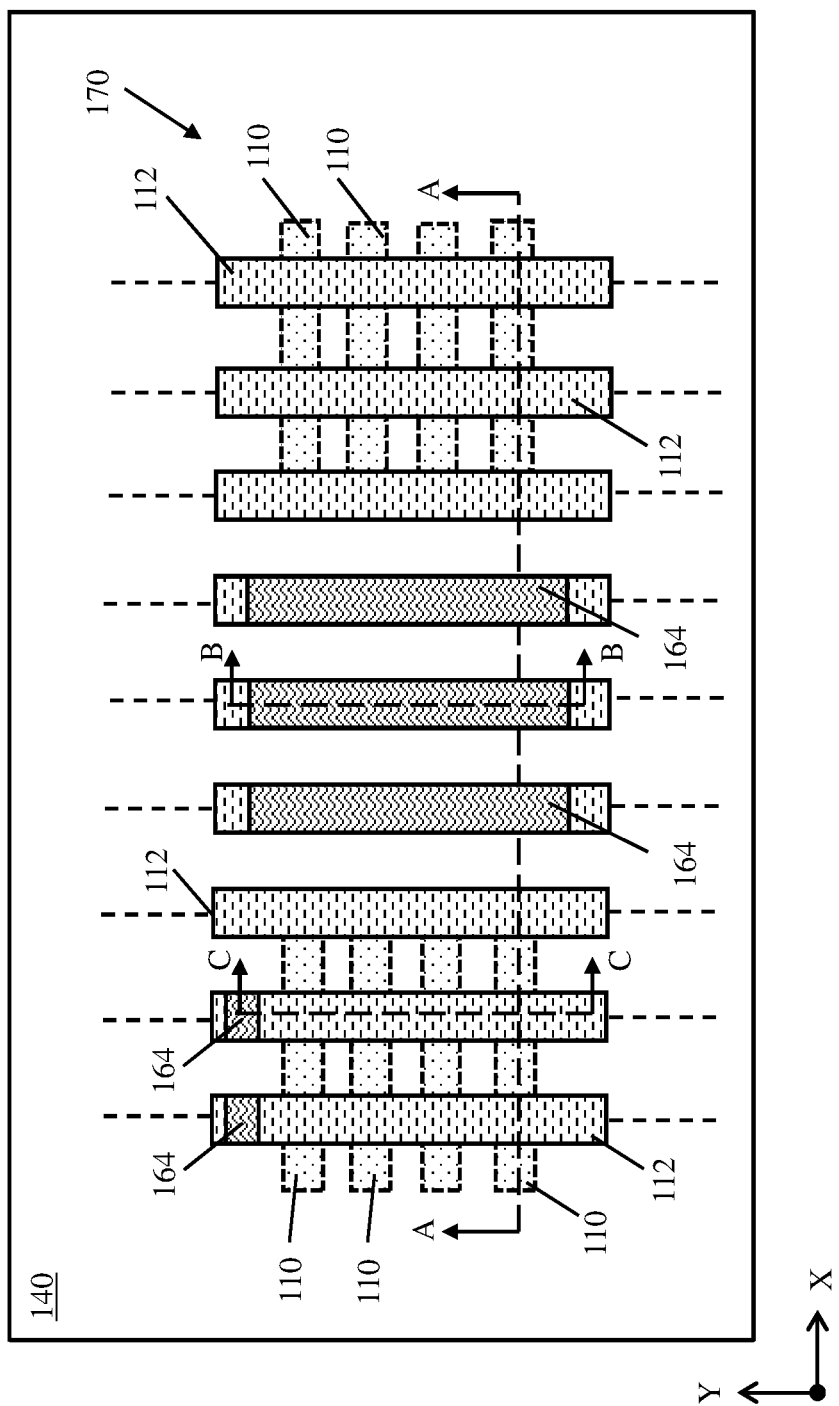
FIG. 21 shows a plan view of an intermediate structure after forming the resistive material and insulative barrier according to embodiments of the disclosure.
Figure 22:
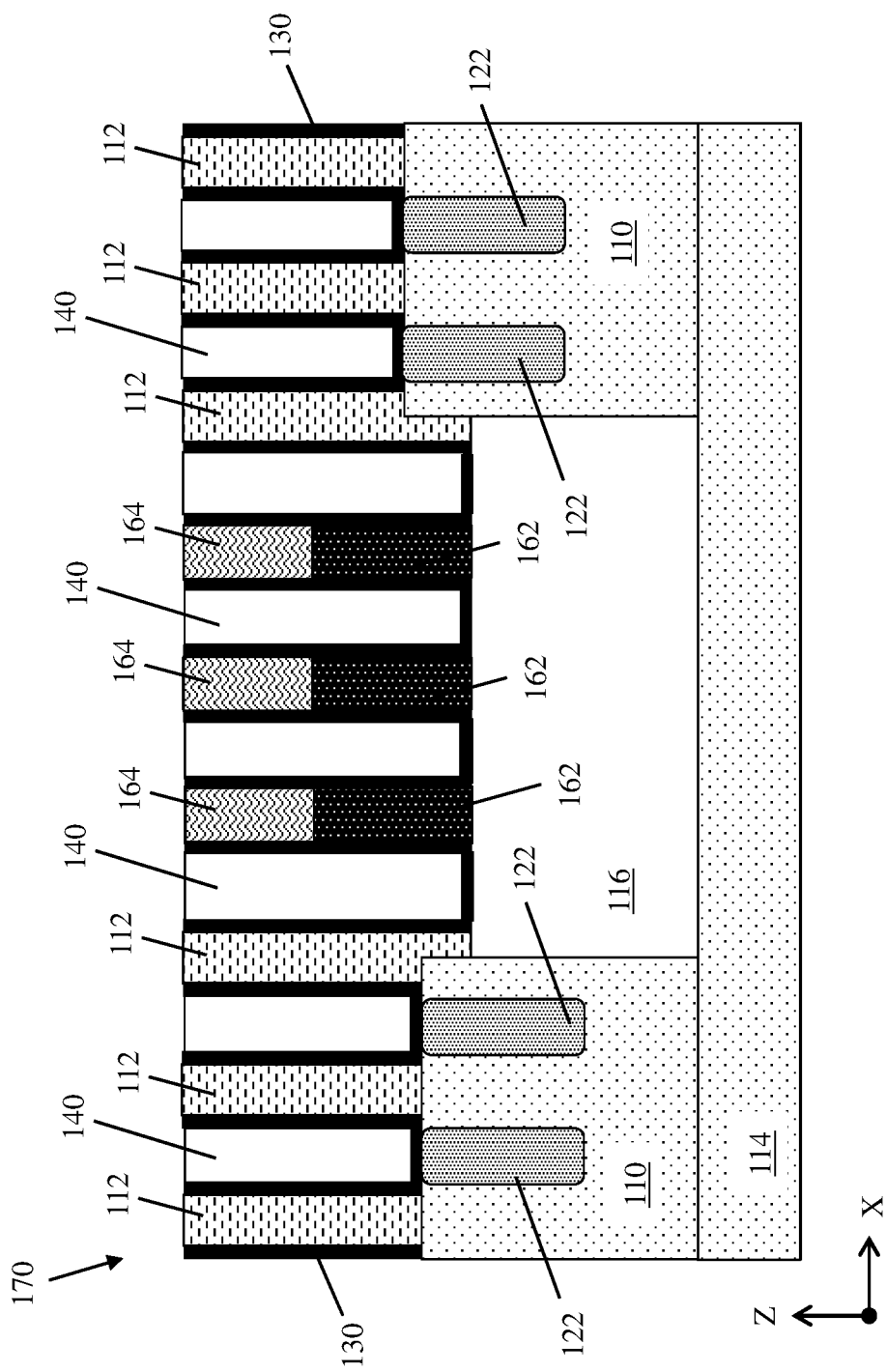
FIG. 22 shows a cross-sectional view along line A-A of FIG. 21 after forming the resistive material and insulative barrier according to embodiments of the disclosure.

Turning to FIGS. 21 and 22, the processes described herein may form an intermediate structure 170. Intermediate structure 170 may be a precursor to an eventual resistor structure for an IC according to embodiments of the disclosure. FIG. 21 provides a plan view of intermediate structure 170 in plane X-Y, showing the location of insulative barrier 164 in preliminary gate structures 112 which do not overlap with active semiconductor regions 110. Resistive material 162 (FIG. 22 only) may be located on STI 116 beneath insulative barrier 164 and horizontally between the previously-formed regions of ILD 140. At least one preliminary gate structure 112 which overlaps active semiconductor region(s) 110 may include a portion of insulative barrier 164. The portion of insulative barrier 164 formed within preliminary gate structure 112 may be formed through the same deposition as insulative barrier(s) 164 on resistive material 162, as discussed herein. The portion of insulative barrier 164 within preliminary gate structure 112 may horizontally separate different transistor gates from each other in the final structure. At this stage, a fabricator may form conductive contacts and other materials to convert intermediate structure 170 into a portion of a device layer for an IC.

Figure 24:
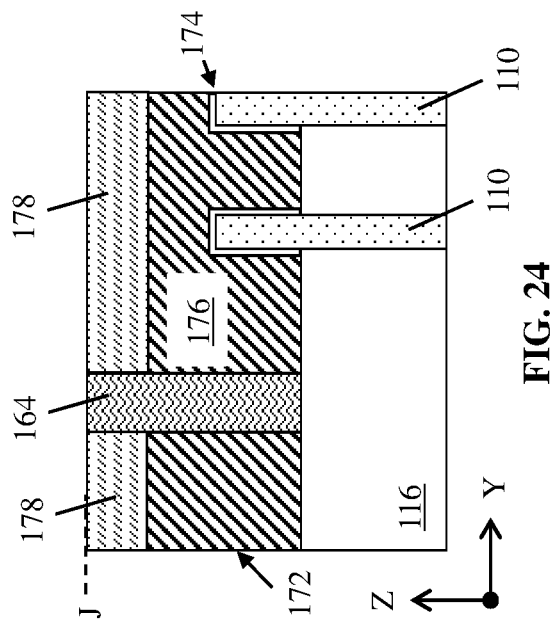
FIG. 24 shows a cross-sectional view along line C-C of FIG. 21 of forming gate caps over gate structures according to embodiments of the disclosure.
Figure 23:
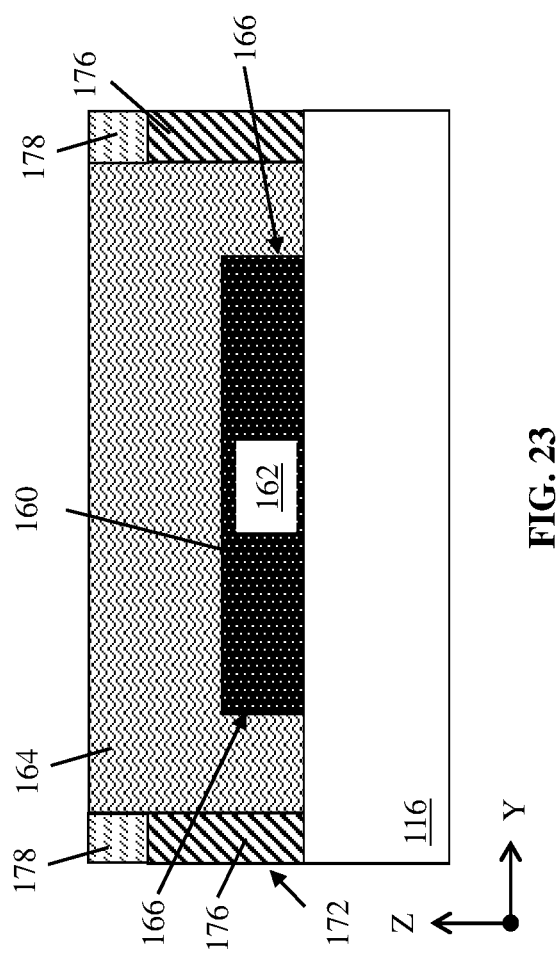
FIG. 23 shows a cross-sectional view along line B-B of FIG. 21 of forming gate caps over gate structures according to embodiments of the disclosure.

Turning to FIGS. 23 and 24, embodiments of the disclosure may include replacing preliminary gate structure(s) 112 (FIGS. 1-22) with conductive gate materials. This process may be known as "replacement metal gate (RMG) processing," and the materials formed by such a process may be known as a "replacement metal gate structure" (RMG) 172. Metal gate replacement is a process in which sacrificial and replaceable dummy gates, e.g., preliminary gate structures 112, are used as a placeholder for metal gate structures during processing that would damage the metal gates, such as S/D region anneals). Each RMG 172 may include one or more functional components used in a high dielectric constant (high-K) metal gate. RMGs 172 may be formed to replace preliminary gate structures 112 and thus may cover one or more active semiconductor regions 110 positioned above substrate 114, e.g., by coating exposed sidewalls and an upper surface of active semiconductor region(s) 110. In some cases, some or all of preliminary gate structure(s) 112 may remain intact in the eventual IC structure. Thus, preliminary gate structures 112 and RMGs 172 may be described or referred to collectively as "gate structures."

RMGs 172 may include one or more conductive components for providing a gate terminal of a transistor. For example, RMGs 172 may include a high dielectric constant (high-K) layer 174, a work function metal (WFM) 176. WFM 176 is positioned over high-K layer 174. High-K layer 174 may include any now known or later developed high-K material typically used for RMGs 172 such as but not limited to: metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). WFM 176 may vary depending on whether for an NFET or PFET device, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. WFM 176 may include any now known or later developed gate conductor such as tungsten (W). WFM 176 may be planarized after being formed (e.g., by CMP or other planarization techniques) such that an upper surface of WFM 176 is substantially coplanar with an upper surface of insulative barrier 164. As RMGs 172 are formed, other previously-formed materials (e.g., resistive material 162, insulative barrier 164, etc.) may remain in place and are substantially unaffected by the procedures to replace preliminary gate structure(s) 112 (FIGS. 1-22) with RMGs 172. An additional gate conductor may be formed to contact and overlie WFM 176 to electrically couple each RMG 172 to subsequently-formed materials, e.g., wires or vias positioned thereon.

Continued formation of RMGs 172 may include forming gate caps 178 over WFMs 176. Gate caps 178 may be formed, e.g., by removing at least a portion of WFM 176 after it is deposited, and thereafter depositing one or more insulative materials to fill the space which the removed conductor previously occupied. The insulative material deposited over WFMs 176 to form gate cap(s) 178 may include one or more insulators similar to or different from the composition of insulative barrier 164, or a different type of insulative material. According to one example, gate cap(s) 178 may include SiN and/or other nitride-based insulators, oxide-based insulators, etc. Gate cap(s) 178 may be formed to provide additional structural and electrical insulation between WFM 176 and overlying materials. Some portions of gate cap(s) 178 may be removed later and replaced with contacts, vias, and/or other conductive components suitable to define the gate terminal of a transistor. Gate cap(s) 178 may be planarized (e.g., by CMP or other planarization processes) after being formed. In this case, an upper surface of gate cap(s) 178 may be substantially coplanar with an upper surface of insulative barrier 164. As shown in FIG. 24, the upper surface of insulative barrier 164 may be substantially coplanar with the upper surface(s) of gate cap(s) 178 of each RMG 172, e.g., substantially along line "J."

Figure 26:
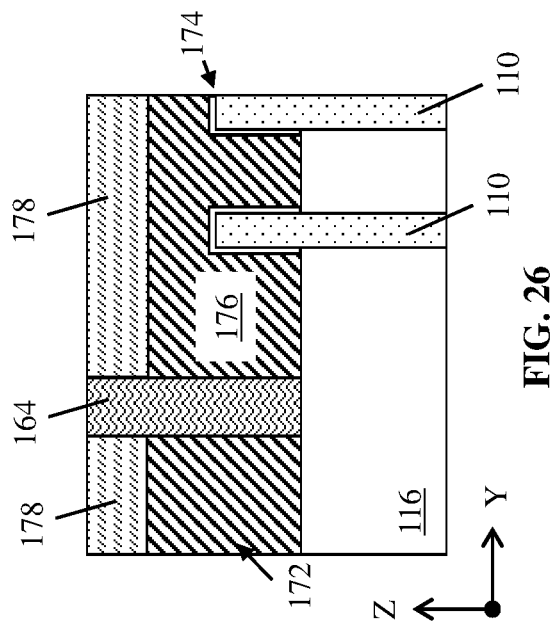
FIG. 26 shows a cross-sectional view along line C-C of FIG. 21 of forming the RMG according to embodiments of the disclosure.
Figure 25:
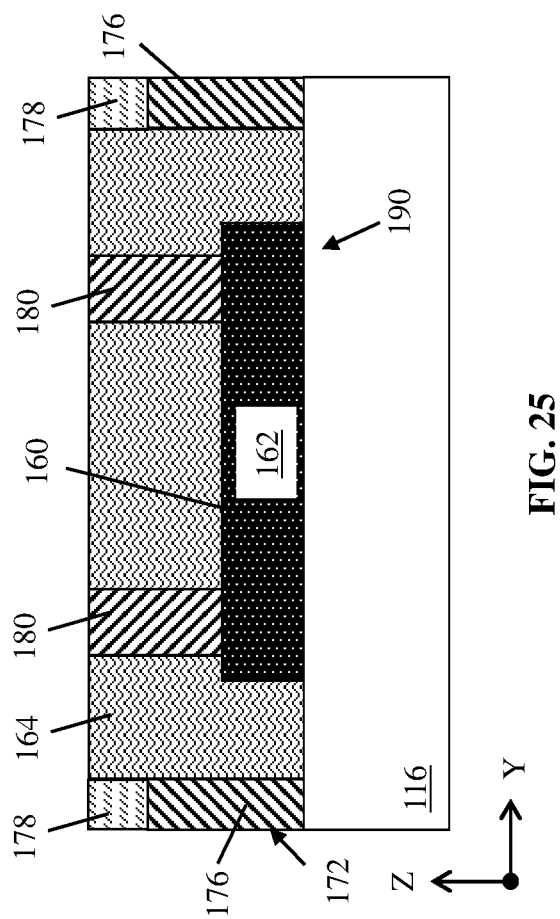
FIG. 25 shows a cross-sectional view along line B-B of FIG. 21 of forming contacts and a replacement metal gate (RMG) according to embodiments of the disclosure.

Proceeding to FIGS. 25 and 26, methods of the disclosure may include processes to form an electrical pathway across resistive material 162. Before, after, or simultaneous with the forming of RMGs 172, a set of resistor contacts (simply "contacts" hereafter) 180 may be formed on resistive material 162 and within insulative barrier 164. To create vacant space where contacts 180 may be formed, embodiments of the disclosure may include forming an intermediate mask (not shown) on insulative barrier 164 and gate cap(s) 178 of RMG(s) 172, and removing portions of insulative barrier 164 (e.g., by etching targeted portions thereof) to expose an underlying portion of resistive material 162 thereunder. Contacts 180 may include any currently known or later developed conductive material configured for use in an electrical contact, e.g., copper (Cu), aluminum (Al), tungsten (W), cobalt (Co), titanium (Ti), etc. Contacts 180 may additionally include refractory metal liners (not shown) positioned on their sidewalls to prevent electromigration degradation, shorting to other components, etc. Contacts 180 in some cases may be formed to include an upper surface substantially coplanar with the upper surfaces of insulative barrier 164 and gate cap(s) 178 of RMG(s) 172. Additional contacts, vias, etc., may be formed in subsequent processing to electrically connect contacts 180 to other portions of a device structure. Resistive material 162 and contacts 180 together define a resistor structure 190, i.e., a two terminal electrical pathway which induces a loss of energy and voltage when current passes through resistive material 162.

Figure 27:
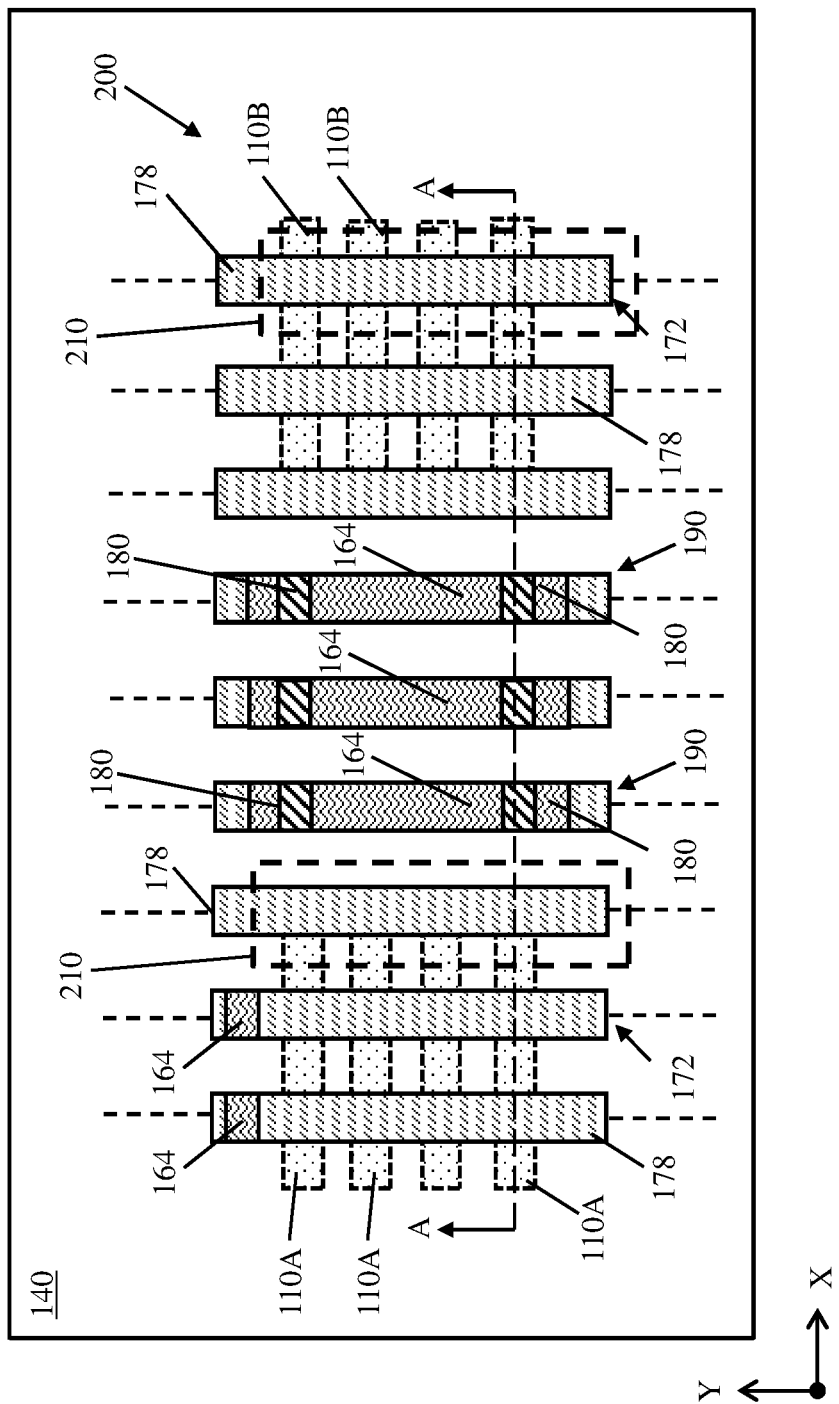
FIG. 27 shows a plan view of a resistor structure for an IC according to embodiments of the disclosure.
Figure 28:
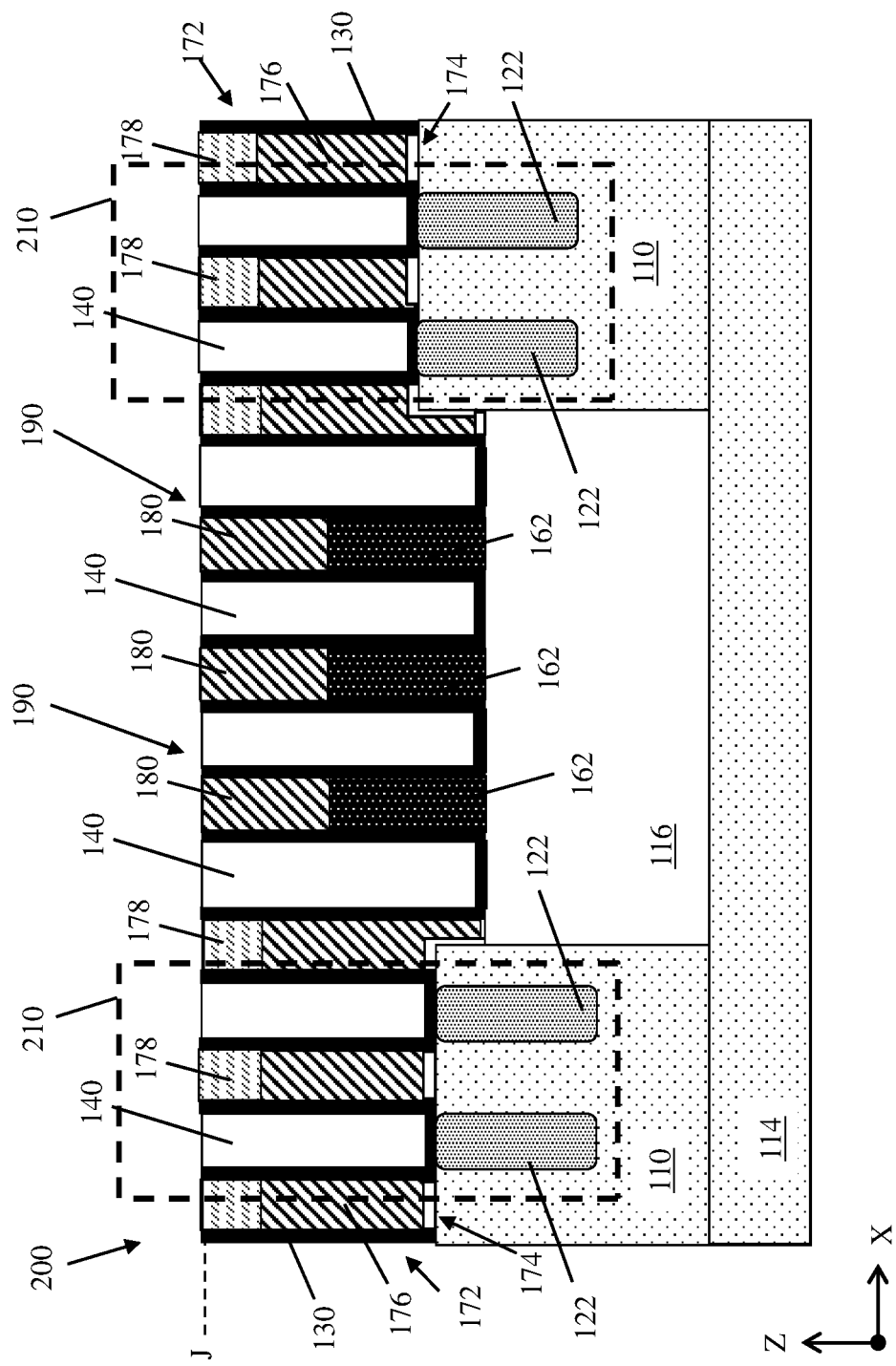
FIG. 28 shows a cross-sectional view along long A-A of FIG. 27 of the resistor structure according to embodiments of the disclosure.

Referring now to FIGS. 27 and 28, embodiments of the disclosure provide an IC structure 200 which includes one or more embodiments of resistor structure 190 therein. FIG. 27 provides a plan view of IC structure 200 in plane X-Y, while FIG. 28 provides a cross-sectional view of resistor structure 190 and IC structure 200 in plane X-Z along line A-A of FIG. 27. Resistor structure 190 may include STI 116 on substrate 114 (FIG. 28), with resistive material 162 being present on a portion of STI 116, e.g., between portions of ILD 140. Insulative barrier 164 (FIG. 27) may be located above STI region 116, thus contacting an upper surface and sidewalls of resistive material 162. The upper surface of resistor structure 190 may be substantially coplanar with the upper surface(s) of each RMG 172, e.g., substantially along line "J" of FIG. 28. Resistive material 162 may include, e.g., poly-Si doped with B, phosphorous, P, and/or As, TiN and/or WSi, or may include still further materials as described elsewhere herein. Insulative barrier 164 may include, e.g., silicon nitride (SiN), and gate cap(s) 178 of IC structure 200 may similarly include SiN or another insulative material. Contacts 180 of resistor structure 190 may be located within insulative barrier 164 (FIG. 27). Each contact 180 may be positioned on resistive material 162 at a respective position, as shown specifically in FIG. 27.

Resistor structure 190 and IC structure 200 may include various additional and/or optional features according to embodiments of the disclosure. For instance one or more FinFET transistors 210 may be positioned over substrate 114 at locations horizontally displaced from resistor structure 190. Each FinFET transistor 210 may include a respective set of S/D regions 122 and RMG(s) 172. FinFET transistor(s) 210 may operate independently of resistor structure 190. In some cases, RMG(s) 172 of one or more FinFET transistor(s) 210 may be horizontally separated from each other by a portion of insulative barrier 164, which may be formed together with insulative barrier 164 of resistor structure 190. Portions of ILD 140 located above S/D regions 122 may be removed and replaced with conductive contacts in subsequent processing to electrically interconnect FinFET transistor(s) 210 to other portions of a device.

Various embodiments of the disclosure may provide resistor structure 190 of IC structure 200 with the various structural features therein. The various features of resistor structure 190 allow resistor structure 190 to be formed by integration into a metal gate replacement process without significantly affecting the formation of other transistors. Additionally, as also noted herein, one or more steps of resistor structure 190 may be suitable to horizontally separate different RMGs 172 from each other by using portions of insulative barrier 164.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A resistor structure for an integrated circuit (IC), the resistor structure comprising:
   a shallow trench isolation (STI) region on a substrate;
   a resistive material above a portion of the shallow trench isolation (STI) region;
   a gate structure on another portion of the STI region, above the substrate, and horizontally displaced from the resistive material;
   an insulative barrier above the STI region and contacting an upper surface and sidewalls of the resistive material, wherein an upper surface of the insulative barrier is substantially coplanar with an upper surface of the gate structure;
   a pair of contacts within the insulative barrier, and each positioned on an upper surface of the resistive material;
   a transistor adjacent the STI region, the transistor including an additional gate structure horizontally displaced from the gate structure; and
   an additional insulative barrier directly horizontally between a first portion of the additional gate structure and a second portion of the additional gate structure.

2. The IC structure of claim 1, wherein the transistor comprises a FinFET transistor.

3. The IC structure of claim 2, wherein the insulative barrier and the additional insulative barrier have a same material composition.

4. The IC structure of claim 1, wherein the resistive material comprises polycrystalline silicon doped with at least one of boron (B), phosphorous (P) or arsenic (As).

5. The IC structure of claim 1, wherein the resistive material comprises titanium nitride (TiN) or tungsten silicide (WSi).

6. The IC structure of claim 1, wherein the insulative barrier includes silicon nitride (SiN), and wherein the gate structure includes a SiN gate cap thereon.

7. The IC structure of claim 1, wherein an upper surface of the pair of contacts is substantially coplanar with an upper surface of the gate structure.

8. A method of forming a resistor structure for an integrated circuit (IC), the method comprising:
    forming a gate structure over a shallow trench isolation (STI) region;
    forming an opening within the gate structure to separate a targeted section of the gate structure from a remainder of the gate structure;
    recessing the targeted section of the gate structure below a height of the remainder of the gate structure;
    implanting a dopant into the targeted section of the gate structure to form a resistive material;
    forming an insulative barrier over the STI region and the resistive material, such that the insulative barrier contacts an upper surface and sidewalls of the resistive material; and
    forming a pair of contacts to an upper surface of the resistive material within the insulative barrier to form the resistor structure.

9. The method of claim 8, wherein the gate structure includes polycrystalline silicon.

10. The method of claim 9, wherein the implanted dopant comprises one of boron (B), phosphorous (P), or arsenic (As).

11. The method of claim 8, further comprising replacing the remainder of the gate structure with a replacement metal gate (RMG) after forming the insulative barrier over the STI region and the resistive material.

12. The method of claim 8, further comprising:
    forming an additional gate structure over a semiconductor fin adjacent the STI region;
    forming an opening within the additional gate structure to separate a first portion of the additional gate structure from a second portion of the additional gate structure; and
    forming the insulative barrier within the opening between the first and second portions of the additional gate structure.

13. The method of claim 12, wherein the gate structure is formed over the STI region horizontally between the semiconductor fin and an additional semiconductor fin adjacent the STI region.

14. A method of forming a resistor structure for an integrated circuit (IC), the method comprising:
    forming a gate structure over a shallow trench isolation (STI) region;
    forming an opening within the gate structure to separate a targeted section of the gate structure from a remainder of the gate structure;
    forming an insulative barrier horizontally between the targeted section of the gate structure and the remainder of the gate structure;
    removing the targeted section of the gate structure to expose an upper surface of the STI region;
    forming a resistive material above the exposed upper surface of the STI region;
    forming an insulative barrier over the STI region and the resistive material, such that the insulative barrier formed over the STI region contacts an upper surface and sidewalls of the resistive material; and
    forming a pair of contacts to an upper surface of the resistive material within the insulative barrier to form the resistor structure.

15. The method of claim 14, wherein the resistive material comprises titanium nitride (TiN) or tungsten silicide (WSi).

16. The method of claim 14, further comprising replacing the remainder of the gate structure with a replacement metal gate (RMG) after forming the insulative barrier over the STI region and the resistive material.

17. The method of claim 14, further comprising:
    forming an additional gate structure over a semiconductor fin adjacent the STI region;
    forming an opening within the additional gate structure to separate a first portion of the additional gate structure from a second portion of the additional gate structure; and
    forming the insulative barrier within the opening between the first and second portions of the additional gate structure.

18. The method of claim 17, wherein the gate structure is formed over the STI region horizontally between the semiconductor fin and an additional semiconductor fin adjacent the STI region.

* * * * *